United States Patent
Tracy et al.

(10) Patent No.: US 7,058,534 B1
(45) Date of Patent: Jun. 6, 2006

(54) METHOD AND APPARATUS FOR APPLICATION SPECIFIC TEST OF PLDS

(75) Inventors: Paul Tracy, Sunnyvale, CA (US); Michael Harms, Pleasanton, CA (US); Jayabrata Ghosh Dastidar, Santa Clara, CA (US); Steven Perry, High Wycombe (GB)

(73) Assignee: Altera Corporation, San Jose, CA (US)

( * ) Notice: Subject to any disclaimer, the term of this patent is extended or adjusted under 35 U.S.C. 154(b) by 114 days.

(21) Appl. No.: 10/394,486

(22) Filed: Mar. 19, 2003

(51) Int. Cl.
*G01R 31/00* (2006.01)

(52) U.S. Cl. .................. 702/117; 716/16

(58) Field of Classification Search .......... 702/57–59, 702/81, 82, 90, 118, 120, 121, 182, 183, 184, 702/189, 117; 716/4, 16, 17; 714/724–726; 326/38, 39; 365/201
See application file for complete search history.

(56) References Cited

U.S. PATENT DOCUMENTS

| | | | |
|---|---|---|---|
| 4,899,067 A | 2/1990 | So et al. | |
| 5,128,871 A * | 7/1992 | Schmitz ................. | 716/17 |
| RE34,444 E * | 11/1993 | Kaplinsky ............... | 326/39 |
| 5,369,314 A | 11/1994 | Patel et al. | |
| 5,434,514 A | 7/1995 | Cliff et al. | |
| 5,592,102 A | 1/1997 | Lane et al. | |
| 5,790,479 A | 8/1998 | Conn | |
| 5,805,794 A * | 9/1998 | Jones et al. ............. | 714/37 |
| 5,812,472 A * | 9/1998 | Lawrence et al. ........ | 365/201 |
| 5,815,510 A * | 9/1998 | Jones et al. ............. | 714/724 |
| 5,991,898 A | 11/1999 | Rajski et al. | |
| 6,034,536 A | 3/2000 | McClintock et al. | |
| 6,107,820 A | 8/2000 | Jefferson et al. | |
| 6,201,404 B1 | 3/2001 | Reddy et al. | |
| 6,233,205 B1 | 5/2001 | Wells et al. | |
| 6,539,508 B1 * | 3/2003 | Patrie et al. ............. | 714/726 |
| 6,600,337 B1 | 7/2003 | Nguyen et al. | |
| 6,687,884 B1 * | 2/2004 | Trimberger .............. | 716/4 |
| 6,725,442 B1 * | 4/2004 | Cote et al. .............. | 716/16 |
| 6,817,006 B1 * | 11/2004 | Wells et al. ............. | 716/16 |
| 2003/0072185 A1 | 4/2003 | Lane et al. | |

OTHER PUBLICATIONS

U.S. Appl. No. 10/317,436, filed Dec. 11, 2002, Plofsky et al., unpublished.
U.S. Appl. No. 10/316,607, filed Dec. 10, 2002, Dastidar et al., unpublished.

(Continued)

*Primary Examiner*—Marc S. Hoff
*Assistant Examiner*—Mohamed Charioui
(74) *Attorney, Agent, or Firm*—Townsend and Townsend and Crew LLP (57) ABSTRACT

Method and apparatus for application specific testing of PLDs. The PLD has a number of resources, less than all of which are used for implementing a customer application. The method includes the following steps. The set of resources that is used for implementing the customer application is identified. A test is then performed only on the set and a test result is generated. Defective resources may be replaced. The PLD is identified as defective only if one of the resources associated with the customer application is defective. Such application specific testing allows the ability of the customer to perform in-system testing, the reduction of the time required for testing the PLD, and the testing of PLDs based on knowledge of the customer's application, among other advantages.

21 Claims, 5 Drawing Sheets

OTHER PUBLICATIONS

U.S. Appl. No. 10/323,506, filed Dec. 18, 2002, Dastidar et al., unpublished.

U.S. Appl. No. 10/459,187, filed Jun. 10, 2003, Dastidar et al., unpublished.

"Fastscan and the ATPG Product Family," product data sheet, Mentor Graphics Corporation 8005 SW Boeckman Road, Wilsonvill, OR (2003).

"Tetramax ATPG, Automatic Test Pattern Generation," product data sheet, Synopsys, Inc. 700 East Middlefield Road, Mountain View, CA (2001).

"Virtex-II EasyPath FAQs" Xilinx, Inc. 2100 Logic Drive San Jose, CA (2002).

"Virtex-II Platform FPGAs: Detailed Description," product specification, DS031-2 (v2.1.1) Dec. 6, 2002, Xilinx, Inc. 2100 Logic Drive San Jose, CA (2002).

"Virtex-II Platform FPGAs: Introduction and Overview," product specification, DS031-1 (v1.9) Sep. 26, 2002, Xilinx, Inc. 2100 Logic Drive San Jose, CA (2002).

* cited by examiner

METHOD AND APPARATUS FOR APPLICATION SPECIFIC TEST OF PLDS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to testing programmable logic devices (PLDs). In particular, the present invention relates to testing those portions of PLDs that are important to customers.

A PLD is a programmable circuit device that can include many diverse components, such as programmable logic (for performing logic operations on input data) as well as specialized components, such as phase-locked loops (PLLs), delay-locked loops (DLLs), digital signal processors (DSPs), memory, etc. The PLD also includes "interconnects" that connect the components to each other and to inputs and outputs. These components and their interconnects may be referred to generally as "resources". The resources of the PLD can be controlled and connected in configurable ways in order to perform whatever specialized application a customer wishes.

Traditional testing of PLDs is similar to testing of other integrated circuit devices. Namely, all the inputs, outputs, resources, and interconnects are tested for defects. Such testing takes time. Such testing is normally performed by specialized equipment at the PLD manufacturer. If a defect is found, the PLD is identified as defective. The defective PLD is not further configured and is not provided to the customer. The defective PLD may be analyzed to determine the cause of the defect, or the defective PLD may simply be scrapped. In either case, the defective PLD can be viewed as an inefficiency that reduces the revenue of the PLD manufacturer.

Testing all of the resources in the entire PLD is time-consuming, in development time as well as actually running the tests. Due to the number of configurations involved and the pins required to run the factory tests, they are also unsuitable for use in a customer's system.

In many cases, the customer does not require the use all the resources of the PLD in the customer's application. In such cases, even if a particular PLD has a defect, if that defect is unimportant to the customer's application, that particular PLD may still be appropriate for the customer.

There is a need for a customer to easily perform testing after receiving the PLD from the manufacturer. Further, there is a need to reduce the time required for testing a PLD. Finally, there is a need to test PLDs based on knowledge of the customer's application.

BRIEF SUMMARY OF THE INVENTION

The present invention is directed toward a method and apparatus for application specific testing of PLDs.

In accordance with one embodiment of the present invention, an apparatus includes a PLD. The PLD includes resources. The resources include a first set and a second set. The first set implements a customer application The first set includes less than all of the resources. The second set is different from the first set. The second set is configured to perform a test on the first set and to generate a test result.

In accordance with another embodiment of the present invention, a system tests a device. The system includes a PLD and a test unit. The PLD has resources. A set of the resources is used for implementing a customer application. The set includes less than all of the resources of the PLD. The test unit is coupled to the PLD and is configured to perform a test only on the set and to generate a test result.

In accordance with yet another embodiment of the present invention, a method tests a PLD having a plurality of resources. The method includes the following steps. First, a set of the resources that is used for implementing a customer application is identified. The identified set includes less than all of the resources on the PLD. Second, a test is performed on the set and a test result is generated.

The embodiments of the present invention allow the testing of PLDs based on the ability of the customer to perform testing, the reduction of the time required for testing a PLD, and knowledge of the customer's application, among other advantages.

BRIEF DESCRIPTION OF THE DRAWINGS

Embodiments of the present invention will now be described with reference to the following detailed description and drawings, in which.

DETAILED DESCRIPTION OF THE INVENTION

Examples of PLDs include various Altera products, such as the Stratix™, APEX™, Cyclone™, FLEX™, ACEX™, and Mercury™ families of field programmable gate arrays (FPGAs), the datasheets of which are incorporated herein by reference. The various embodiments of the present invention are applicable to these and other types of PLDs.

Figure 1:
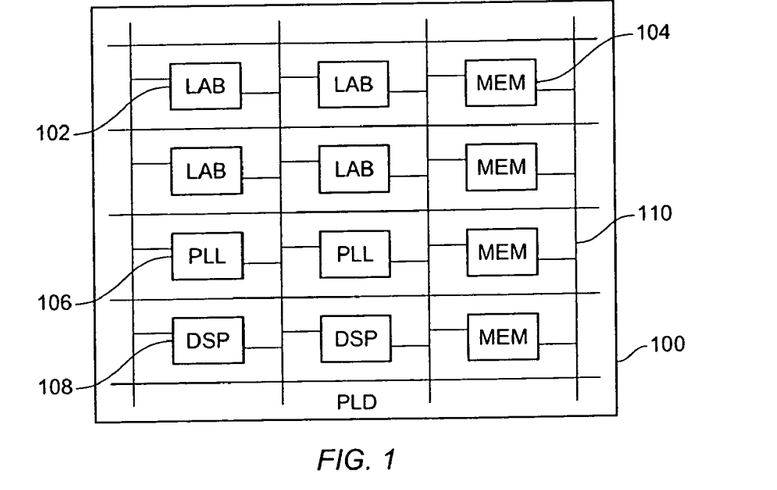
FIG. 1 is a block diagram of a PLD according to an embodiment of the present invention.

FIG. 1 is a block diagram generally showing a PLD 100 according to an embodiment of the present invention. The PLD 100 includes numerous resources. Some specific resources shown are logic array blocks (LABs) 102, memories 104, phase-locked loops (PLLs) 106, and digital signal processors (DSPs) 108, all connected by interconnects 110. Many other types of resources may also be provided on the PLD 100. The PLD 100 also includes input and output portions (not shown).

For customer applications, the resources necessary to implement the applications are connected together via the interconnect 110. For a specific customer application, however, not all the resources (including not all the interconnect 110) may be necessary to implement that specific function.

Figure 2:
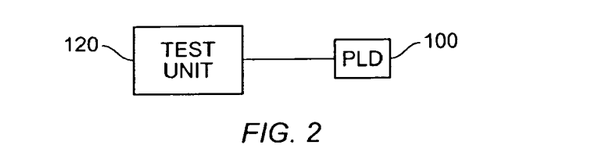
FIG. 2 is a block diagram of an external test system according to an embodiment of the present invention.
Figure 3:
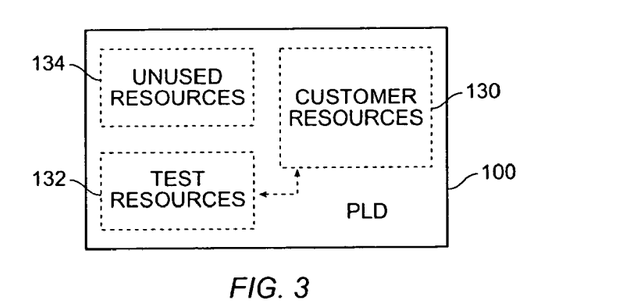
FIG. 3 is a block diagram of an internal test system according to an embodiment of the present invention.
Figure 4:
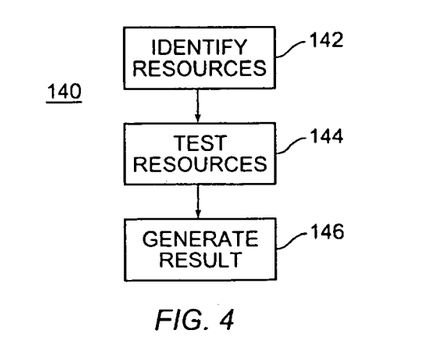
FIG. 4 is a flowchart of a method according to an embodiment of the present invention.

Embodiments of the present invention are directed toward taking advantage of the fact that not all resources of the PLD are used and applying this advantage in the PLD testing area. FIGS. 2–3 are block diagrams showing two general embodiments according to the present invention. FIG. 4 is a flowchart showing the general operation of a method according to an embodiment of the present invention.

In FIG. 2, the PLD 100 is tested by an external test unit 120. The test unit 120 may be similar to existing test units for testing PLDs. However, the test unit 120 is additionally programmed to be aware of the customer application. The test unit 120 tests only those resources of the PLD 100 that are actually used in the customer application. Testing with the test unit 120 is most likely to be performed at the PLD manufacturer, not at the customer. For such testing, registers of the PLD may be used to drive and capture the data via test features like register scan.

In FIG. 3, the PLD 100 includes a set 130 of resources that is used for implementing the customer application. This set 130 may be referred to as the customer resources 130. The customer resources 130 are less than all of the resources of the PLD 100. This leaves a second set 132 of resources that is used for testing the customer resources 130. This second set 132 may be referred to as the test resources 132. The testing performed by the test resources 132 may be referred to as built-in self testing (BIST) because the test resources 132 are located on the PLD 100. The remaining resources of the PLD 100 may be referred to as unused resources 134. (Note that the test resources 132 were part of the unused resources prior to their configuration as test resources 132.)

In FIG. 4, the method 140 includes three steps 142, 144 and 146. In step 142, a set of resources that is used for the customer application is identified. This set includes less than all of the resources of the PLD 100. In step 144, testing is performed on the resources associated with the customer application. In step 146, a test result is generated.

Figure 5:
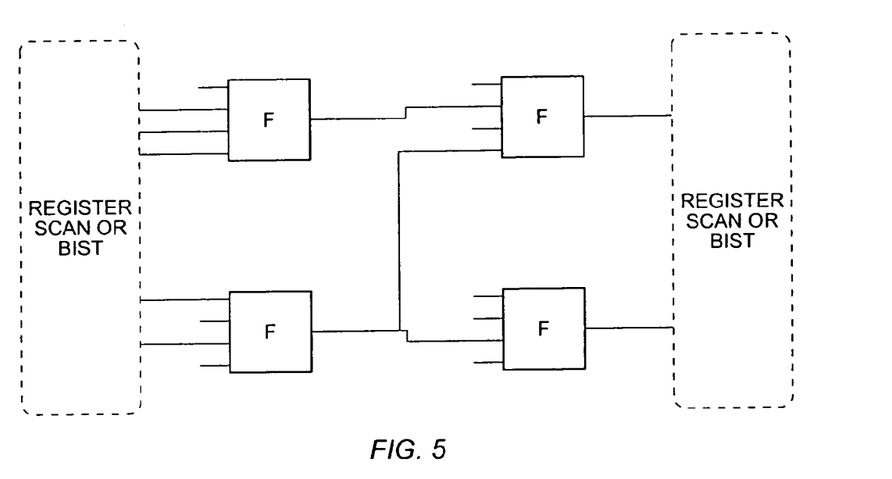
FIG. 5 is a block diagram of interconnect testing according to an embodiment of the present invention.
Figure 6:
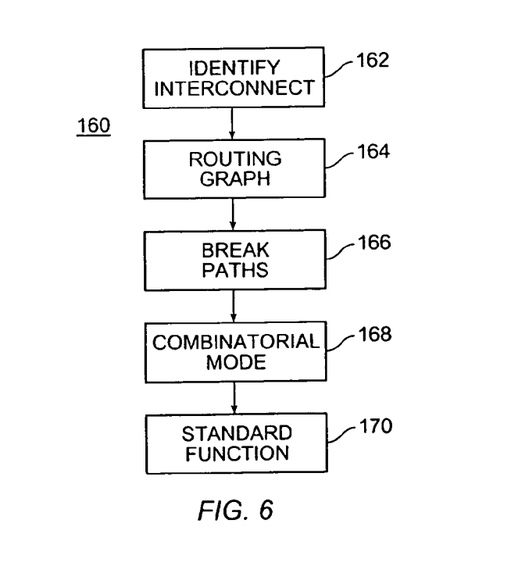
FIG. 6 is a flowchart of a method of interconnect testing according to an embodiment of the present invention.
Figure 7:
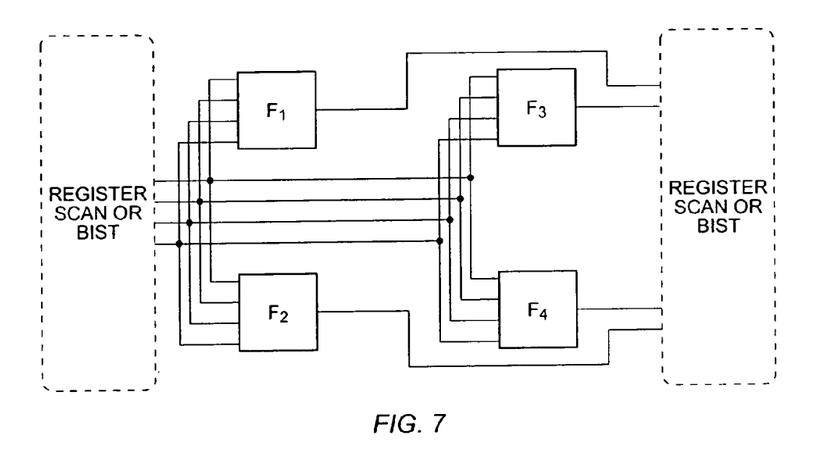
FIG. 7 is a block diagram of logic element testing according to an embodiment of the present invention.
Figure 8:
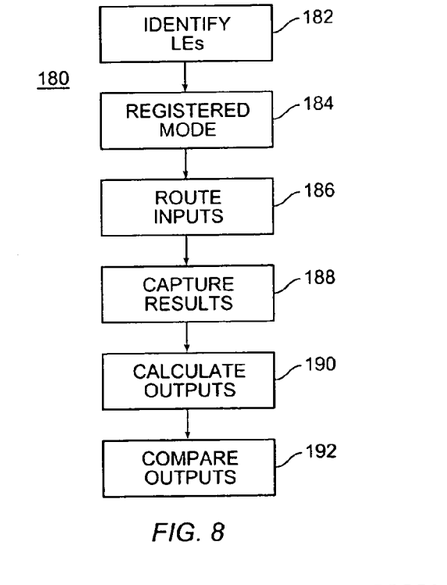
FIG. 8 is a flowchart of a method of logic element according to an embodiment of the present invention.
Figure 9:
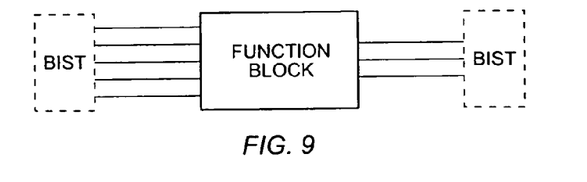
FIG. 9 is a block diagram of function block testing according to an embodiment of the present invention.
Figure 10:
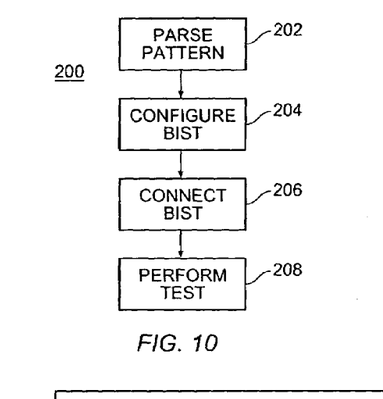
FIG. 10 is a flowchart of a method of function block testing according to an embodiment of the present invention.

FIGS. 5–10 provide more details on the specific types of testing performed. In general, a toolset may be used to develop application specific tests for the different component types of the PLD. FIGS. 5–6 detail interconnect testing. FIGS. 7–8 detail logic element testing. FIGS. 9–10 detail function block testing.

FIG. 5 is a block diagram showing interconnect testing according to an embodiment of the present invention. According to one embodiment, the interconnect includes a number of 4-input lookup tables (LUTs) (not shown) for routing. The interconnect testing may be performed via a register scan (see above regarding FIG. 2) or via BIST (see above regarding FIG. 3). A standard testing function F may be used.

FIG. 6 is a flowchart detailing the steps 160 performed in interconnect testing according to an embodiment of the present invention. In step 162, the toolset identifies the interconnect being used by parsing the pattern of the customer application. In step 164, the identified interconnect is put into a routing graph format. In step 166, any combinatorial feedback paths are broken. In step 168, the toolset places all of the logic elements joined by the identified interconnect into combinatorial mode. In step 170, the standard function F is put into all of the LUTs to provide full observability of all four inputs like an exclusive-OR (XOR).

For factory testing of the interconnect, registers may be used to drive and capture the data via test features like a register scan (see above regarding FIG. 2). For in-system BIST of the interconnect, unused logic elements may be configured as BIST machines both to control the start points of the routed interconnect graph and to observe the end points. For both types of testing, all of the identified interconnect should be observed to toggle properly in order for the test pattern to pass.

FIG. 7 is a block diagram showing logic element testing according to an embodiment of the present invention. According to one embodiment, the logic elements include a number of 4-input lookup tables (LUTs) (not shown), which are function generators that can implement any function of four variables. The logic element testing may be performed via a register scan (see above regarding FIG. 2) or via BIST (see above regarding FIG. 3). A standard testing function F may be used. The customer's function (corresponding to the customer application) may also be used.

FIG. 8 is a flowchart detailing the steps 180 performed in logic element testing according to an embodiment of the present invention. In step 182, the toolset identifies the logic elements being used in the customer application. In step 184, the identified logic elements are put into registered mode. The identified logic elements otherwise retain the same configurations they would have in the customer application. In step 186, identical LUT inputs and secondary signals are routed to the active logic elements, either from pins (or register scan) or from a BIST machine. In step 188, all 16 possible LUT input combinations are applied and the results captured, either in the register or by the BIST. In step 190, the toolset calculates the expected output for each logic element based on the customer application's LUT settings. (Step 190 may be performed at any time prior to step 192, not necessarily after step 188.) In step 192, the results of step 188 are compared with the expected outputs of step 190 and a test result is generated.

For factory testing (see above regarding FIG. 2), the test may observe the registers through the register scan test feature. For in-system BIST (see above regarding FIG. 3), a scan chain may be explicitly routed in user mode, which may lead to a signature comparator implemented in unused logic elements. Other secondary signals, such as clear signals, may be tested in a similar manner.

FIG. 9 is a block diagram showing function block testing according to an embodiment of the present invention. The term function block is used to refer generically to special-purpose blocks other than interconnect and logic elements. Examples of function blocks include memories, DSPs, PLLs, DLLs, etc. Such function blocks have varying numbers and types of inputs and outputs depending on the specific function performed by each function block. BIST may be used for both factory and in-system testing.

FIG. 10 is a flowchart detailing the steps 200 performed in function block testing according to an embodiment of the present invention. In step 202, the toolset determines which blocks of each type should be tested, by parsing the pattern corresponding to the customer application. In step 204, various BIST machines are configured out of the unused logic elements and interconnect of the PLD. In step 206, a BIST machine applicable to each particular function block type is connected to the block's inputs, and an appropriate signature comparator BIST machine is connected to the block's outputs. The BIST machines used may be in the unused areas surrounding the blocks under test. In step 208, testing is performed and the test result is generated.

FIGS. 11–14 relate to timing and state machine diagrams for the different variations of BIST machines according to various embodiments of the present invention. In general, all the different variations of BIST machines appear the same from the outside. The timing and state machine diagrams of FIGS. 11–14 show the external signals used and the general operation of the state machines.

Figure 11:
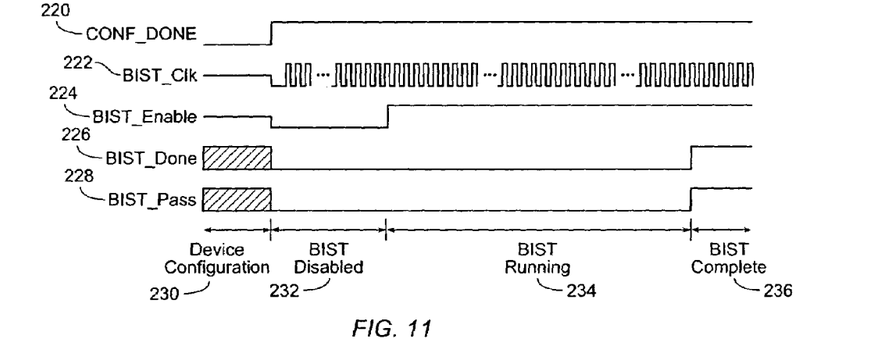
FIG. 11 is a timing diagram of testing according to an embodiment of the present invention.

FIG. 11 is a timing diagram for the situation when the BIST clock is not through a PLL on the PLD 100. It includes the signals CONF_DONE 220, BIST_Clk 222, BIST_Enable 224, BIST_Done 226, and BIST_Pass 228. FIG. 11 also includes four states, the Device Configuration state 230, the BIST Disabled state 232, the BIST Running state 234, and the BIST Complete state 236.

Figure 12:
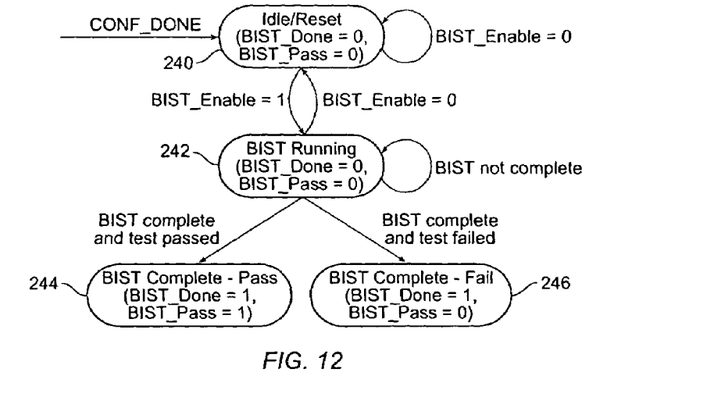
FIG. 12 is a state diagram relating to FIG. 11.

FIG. 12 is a state diagram for the situation when the BIST clock is not through a PLL on the PLD 100. It includes the Idle/Reset state 240, the BIST Running state 242, the BIST Complete Pass state 244, and the BIST Complete Fail state 246. The Idle/Reset state 240 is related to the Device Configuration state 230 and the BIST Disabled state 232. The BIST Running state 242 is related to the BIST Running state 234. The BIST Complete Pass state 244 and the BIST Complete Fail state 246 are related to the BIST Complete state 236.

FIGS. 11–12 are best understood when considered together. The Device Configuration state 230 occurs while the CONF_DONE signal 220 remains low. When the CONF_DONE signal 220 goes high, device configuration is complete and the BIST Disabled state 232 is entered (FIG. 11) and the Idle/Reset state 240 is entered (FIG. 12). It stays in the BIST Disabled state 232 and the Idle/Reset state 240 while the BIST_Enable signal 224 remains low. The BIST_Done signal 226 and the BIST_Pass signal 228 remain low in the Idle/Reset state 240. During this time, the BIST_Clk 222 begins clocking.

When the BIST_Enable signal 224 goes high, the BIST Running state 234 (FIG. 11) and the BIST Running state 242 (FIG. 12) are entered. In this state, the BIST is being performed on the resources used in the customer application. It remains in this state as long as the BIST is not complete; unless the BIST_Enable signal 224 goes low, in which case it returns to the Idle/Reset state 240.

When the BIST is complete, the BIST_Done signal 226 goes high and the BIST Complete state 236 is entered (FIG. 11). If the test result indicates that the resources passed the test, the BIST Complete Pass state 244 is entered and the BIST_Pass signal 228 goes high. If the test result indicates a failure, the BIST Complete Fail state 246 is entered and the BIST_Pass signal 228 goes low.

Figure 13:
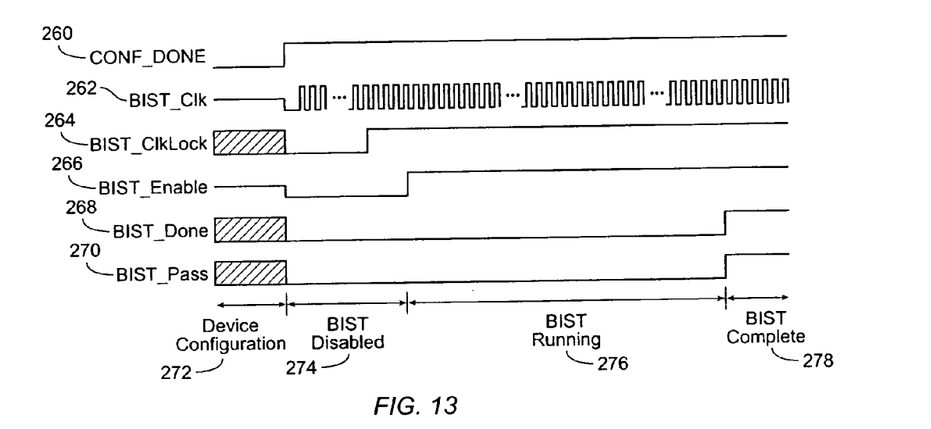
FIG. 13 is a timing diagram of testing according to an embodiment of the present invention.

FIG. 13 is a timing diagram for the situation when the BIST clock is through a PLL on the PLD 100. It includes the signals CONF_DONE 260, BIST_Clk 262, BIST_ClkLock 264, BIST_Enable 266, BIST_Done 268, and BIST_Pass 270. FIG. 13 also includes four states, the Device Configuration state 272, the BIST Disabled state 274, the BIST Running state 276, and the BIST Complete state 278.

Figure 14:
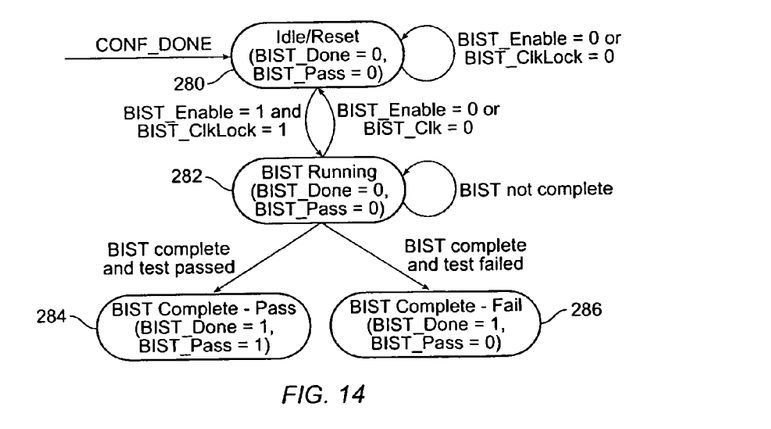
FIG. 14 is a state diagram relating to FIG. 13.

FIG. 14 is a state diagram for the situation when the BIST clock is through a PLL on the PLD 100. It includes the Idle/Reset state 280, the BIST Running state 282, the BIST Complete Pass state 284, and the BIST Complete Fail state 286. The Idle/Reset state 280 is related to the Device Configuration state 272 and the BIST Disabled state 274. The BIST Running state 282 is related to the BIST Running state 276. The BIST Complete Pass state 284 and the BIST Complete Fail state 286 are related to the BIST Complete state 278.

FIGS. 13–14 are best understood when considered together. The Device Configuration state 272 occurs while the CONF_DONE signal 260 remains low. When the CONF_DONE signal 260 goes high, device configuration is complete and the BIST Disabled state 274 is entered (FIG. 11) and the Idle/Reset state 280 is entered (FIG. 12). It stays in the BIST Disabled state 274 and the Idle/Reset state 280 while the BIST_Enable signal 266 remains low or the BIST_ClkLock signal 264 remains low. The BIST_Done signal 268 and the BIST_Pass signal 270 remain low in the Idle/Reset state 280. During this time, the BIST_Clk 262 begins clocking. At some point during the BIST Disabled state 274, the BIST_ClkLock signal 264 goes high.

When the BIST_Enable signal 266 goes high (and the BIST_ClkLock signal 264 remains high), the BIST Running state 276 (FIG. 11) and the BIST Running state 282 (FIG. 12) are entered. In this state, the BIST is being performed on the resources used in the customer application. It remains in this state as long as the BIST is not complete; unless the BIST_Enable signal 266 goes low or the BIST_ClkLock signal 264 goes low, in which case it returns to the Idle/Reset state 280.

When the BIST is complete, the BIST_Done signal 268 goes high and the BIST Complete state 278 is entered (FIG. 11). If the test result indicates that the resources passed the test, the BIST Complete Pass state 284 is entered and the BIST_Pass signal 270 goes high. If the test result indicates a failure, the BIST Complete Fail state 286 is entered and the BIST_Pass signal 270 goes low.

As mentioned above, embodiments of the present invention have numerous advantages over existing systems. One such advantage is the reduction in manufacturing cost, which is provided from two aspects. The first aspect is an increase in effective yield, since a minor defect in a resource may be acceptable if it does not affect the targeted application. (In the past, such defective dies would have been scrapped.) The second aspect is a reduction in the time required to perform testing. Fewer resources to test translate into less routing congestion and fewer configurations. (Test time is directly proportional to the number of configurations).

Another such advantage is that it enables customers to do in-system BIST for their PLDs. If their system experiences a failure, the in-system BIST can indicate whether or not the PLD is at fault. This is especially useful in instances where redundant devices on their board can be switched in for in-system repair. The in-system BIST will signal the repair circuitry to indicate that the backup circuitry should be engaged. Without in-system BIST, the customer would need either to take the board offline (causing costly downtime) or to develop their own functional tests for the PLD (which can be costly in terms of test time and board routing). In addition, when combined with the remote update feature, the need for an intelligent microcontroller to actually run the sequence of configurations is removed.

Although the above description has focused on specific embodiments, various modifications and their equivalents are to be considered within the scope of the present invention, which is defined by the following claims.

What is claimed is:

1. An apparatus including a programmable logic device (PLD), comprising:
    a plurality of resources, said plurality of resources including:
        a first set that implements a customer application, wherein said first set includes less than all of said plurality of resources; and
        a second set, different from said first set, that is configured as a built in self testing machine to perform a test on said first set and to generate a test result;
    wherein said plurality of resources includes a plurality of interconnects, wherein said first set includes less than all of said plurality of interconnects corresponding to said customer application, and wherein said second set is configured to put said first set into a routing graph format, to break one or more combinatorial feedback paths in said first set, to place a plurality of logic elements joined by said first set into combinatorial mode, and to put a standard function into a plurality of lookup tables of said first set.

2. The apparatus of claim 1, wherein said second set comprises resources unused for implementing said customer application.

3. The apparatus of claim 1, wherein said plurality of resources includes one or more of:
    a plurality of interconnects;
    a plurality of logic elements; and
    a plurality of function blocks.

4. The apparatus of claim 1, wherein said plurality of resources includes a plurality of interconnects, and wherein said second set is configured to perform said test on less than all of said plurality of interconnects corresponding to said customer application.

5. The apparatus of claim 1, wherein said plurality of resources includes a plurality of logic elements, and wherein said second set is configured to perform said test on less than all of said plurality of logic elements corresponding to said customer application.

6. The apparatus of claim 1, wherein said plurality of resources includes a plurality of logic elements, wherein said first set includes less than all of said plurality of logic elements corresponding to said customer application, and wherein said second set is configured to put said first set into a registered mode, to route a plurality of inputs to said first set, to capture a plurality of results resulting from said plurality of inputs, to calculate a plurality of expected results, and to compare said plurality of results to said plurality of expected results.

7. The apparatus of claim 1, wherein said plurality of resources includes a plurality of function blocks, and wherein said second set is configured to perform said test on less than all of said plurality of function blocks corresponding to said customer application.

8. The apparatus of claim 1, wherein said plurality of resources includes a plurality of function blocks, wherein said first set includes less than all of said plurality of function blocks corresponding to said customer application, and wherein said second set is configured to perform one or more tests, to connect to said first set, and to test said first set such that a test performed by one of said second set corresponds to a function of one of said first set.

9. The apparatus of claim 1, wherein said test result indicates that said PLD is defective only if said test result indicates that said first set, which is associated with said customer application, has a defect.

10. A method of testing a programmable logic device (PLD) having a plurality of resources, said method comprising the steps of:
    identifying a set of said plurality of resources that is used for implementing a customer application, wherein said set includes less than all of said plurality of resources;
    performing a test on said set; and
    generating a test result,
    wherein said plurality of resources includes a plurality of interconnects, wherein said set includes less than all of said plurality of interconnects corresponding to said customer application, and wherein said step of performing said test comprises:
    putting said set into a routing graph format;
    breaking one or more combinatorial feedback paths in said set;
    placing a plurality of logic elements joined by said set into combinatorial mode; and
    putting a standard function into a plurality of lookup tables of said set.

11. The method of claim 10, wherein said plurality of resources includes a plurality of logic elements, and wherein said step of performing said test comprises:
    performing said test on less than all of said plurality of logic elements corresponding to said customer application and generating said test result.

12. The method of claim 10, wherein said plurality of resources includes the plurality of logic elements, wherein said set includes less than all of said plurality of logic elements corresponding to said customer application, and wherein said step of performing said test comprises:
    putting said set into a registered mode;
    routing a plurality of inputs to said set;
    capturing a plurality of results resulting from said plurality of inputs;
    calculating a plurality of expected results; and
    comparing said plurality of results to said plurality of expected results.

13. The method of claim 10, wherein said plurality of resources includes a plurality of function blocks, and wherein said step of performing said test comprises:
    performing said test on less than all of said plurality of function blocks corresponding to said customer application and generating said test result.

14. The method of claim 10, further comprising:
    indicating that said PLD is defective only if said test result indicates that said set, which is associated with said customer application, has a defect.

15. The method of claim 10, wherein said test is performed by components external to said PLD.

16. A system for testing a device, comprising:
    a programmable logic device (PLD) having a plurality of resources, wherein a set of said plurality of resources is used for implementing a customer application, and wherein said set includes less than all of said plurality of resources;
    a test unit, coupled to said PLD, configured to perform a test only on said set and to generate a test result,
    wherein said plurality of resources includes a plurality of interconnects, wherein said set includes less than all of said plurality of interconnects corresponding to said customer application, and wherein said test unit is configured to put said set into a routing graph format, to break one or more combinatorial feedback paths in said set, to place a plurality of logic elements joined by said set into combinatorial mode, and to put a standard function into a plurality of lookup tables of said set.

17. The system of claim 16, wherein said plurality of resources includes a plurality of logic elements, and wherein said test unit is configured to perform said test on less than all of said plurality of logic elements corresponding to said customer application.

18. The system of claim 16, wherein said plurality of resources includes a plurality of logic elements, wherein said set includes less than all of said plurality of logic elements corresponding to said customer application, and wherein said test unit is configured to put said set into a registered mode, to route a plurality of inputs to said set, to capture a plurality of results resulting from said plurality of inputs, to calculate a plurality of expected results, and to compare said plurality of results to said plurality of expected results.

19. The system of claim 16, wherein said plurality of resources includes a plurality of function blocks, and wherein said test unit is configured to perform said test on less than all of said plurality of function blocks corresponding to said customer application.

20. The system of claim 16, wherein said plurality of resources includes a plurality of function blocks, wherein said set includes less than all of said plurality of function blocks corresponding to said customer application, and wherein said test unit is configured to perform one or more tests, to connect to said set, and to test said set such that a test performed by said test unit corresponds to a function of one of said first set.

21. The system of claim 16, wherein said test unit identifies said PLD as defective only if said test result indicates a defect in said set that is used for said customer application.

* * * * *